(12) United States Patent
Zhu et al.

(10) Patent No.: US 11,404,568 B2
(45) Date of Patent: Aug. 2, 2022

(54) SEMICONDUCTOR DEVICE HAVING INTERFACE STRUCTURE

(71) Applicant: INSTITUTE OF MICROELECTRONICS, CHINESE ACADEMY OF SCIENCES, Beijing (CN)

(72) Inventors: Huilong Zhu, Poughkeepsie, NY (US); Zhenhua Wu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 186 days.

(21) Appl. No.: 16/627,711

(22) PCT Filed: Nov. 30, 2018

(86) PCT No.: PCT/CN2018/118633
§ 371 (c)(1),
(2) Date: Dec. 30, 2019

(87) PCT Pub. No.: WO2020/073459
PCT Pub. Date: Apr. 16, 2020

(65) Prior Publication Data
US 2021/0336055 A1    Oct. 28, 2021

(30) Foreign Application Priority Data
Oct. 10, 2018   (CN) .......................... 201811178260.2

(51) Int. Cl.
*H01L 29/78*   (2006.01)
*H01L 29/08*   (2006.01)
(Continued)

(52) U.S. Cl.
CPC ...... *H01L 29/7827* (2013.01); *H01L 29/0847* (2013.01); *H01L 29/267* (2013.01); *H01L 29/66666* (2013.01)

(58) Field of Classification Search
CPC ............. H01L 29/7827; H01L 29/0847; H01L 29/267; H01L 29/66666
(Continued)

(56) References Cited

U.S. PATENT DOCUMENTS 5,367,184 A * 11/1994 Chantre ............ H01L 29/66242
                                        257/E29.189
5,920,088 A *  7/1999 Augusto ........... H01L 29/78651
                                        257/E21.643
(Continued)

FOREIGN PATENT DOCUMENTS

CN    106298792 A    1/2017
CN    107845578 A    3/2018
(Continued)

*Primary Examiner* — Mohammad M Hoque
(74) *Attorney, Agent, or Firm* — Christensen, Fonder, Dardi & Herbert PLLC

(57) ABSTRACT

A semiconductor device, including: a substrate; a first source/drain layer, a channel layer, and a second source/drain layer sequentially stacked on the substrate and adjacent to each other, and a gate stack formed around an outer circumference of the channel layer; wherein at least one interface structure is formed in at least one of the first source/drain layer and the second source/drain layer, the conduction band energy levels at both sides of the interface structure are different and/or the valence band energy levels are different.

20 Claims, 6 Drawing Sheets

(51) Int. Cl.
*H01L 29/267* (2006.01)
*H01L 29/66* (2006.01)

(58) Field of Classification Search
USPC .......................................................... 257/288
See application file for complete search history.

(56) References Cited

U.S. PATENT DOCUMENTS

| | | | | |
|---|---|---|---|---|
| 9,337,255 | B1* | 5/2016 | Basu | H01L 29/41741 |
| 9,620,591 | B2* | 4/2017 | Yu | H01L 29/7827 |
| 9,780,100 | B1* | 10/2017 | Balakrishnan | H01L 21/02573 |
| 9,806,203 | B2* | 10/2017 | Then | H01L 29/0673 |
| 10,090,193 | B1 | 10/2018 | Chanemougame et al. | |
| 10,916,638 | B2* | 2/2021 | Cheng | H01L 21/76805 |
| 11,158,732 | B2* | 10/2021 | Cho | H01L 29/1054 |
| 2009/0008631 | A1* | 1/2009 | Hurkx | B82Y 10/00 |
| | | | | 257/E21.41 |
| 2011/0062523 | A1* | 3/2011 | Masuoka | H01L 21/823885 |
| | | | | 257/E27.06 |
| 2014/0166981 | A1* | 6/2014 | Doyle | H01L 21/02636 |
| | | | | 438/270 |
| 2015/0041921 | A1* | 2/2015 | Choi | B82Y 10/00 |
| | | | | 438/283 |
| 2015/0091058 | A1* | 4/2015 | Doyle | H01L 29/749 |
| | | | | 257/192 |
| 2016/0053421 | A1* | 2/2016 | Lonati | D04B 15/92 |
| | | | | 112/63 |
| 2016/0064221 | A1* | 3/2016 | Colinge | H01L 29/068 |
| | | | | 438/285 |
| 2018/0269280 | A1* | 9/2018 | Sanchez | H01L 29/7391 |
| 2018/0269284 | A1* | 9/2018 | Ansari | H01L 29/0673 |
| 2019/0355843 | A1* | 11/2019 | Then | H01L 21/76224 |
| 2021/0066502 | A1* | 3/2021 | Karda | H01L 27/1159 |

FOREIGN PATENT DOCUMENTS

| | | |
|---|---|---|
| CN | 107887327 A | 4/2018 |
| CN | 107887441 A | 4/2018 |

\* cited by examiner

SEMICONDUCTOR DEVICE HAVING INTERFACE STRUCTURE

CROSS-REFERENCE TO RELATED APPLICATIONS

This application is a U.S. national phase application of PCT Application No. PCT/CN2018/118633, filed on Nov. 30, 2018, entitled "SEMICONDUCTOR DEVICE, METHOD OF FABRICATING THE SAME, AND ELECTRONIC APPARATUS INCLUDING THE SAME" which claims the benefit of priority to the Chinese patent application No. 201811178260.2, entitled "SEMICONDUCTOR DEVICE, METHOD OF FABRICATING THE SAME, AND ELECTRONIC APPARATUS INCLUDING THE SAME", filed on Oct. 10, 2018, the disclosures of which are incorporated herein by reference in their entireties.

TECHNICAL FIELD

The present application relates to the field of semiconductors, and in particular to a vertical-type semiconductor device and a method of fabricating the same, and an electronic apparatus including such semiconductor device.

BACKGROUND

Horizontal-type semiconductor devices, such as metal oxide semiconductor field effect transistors (MOSFETs), are widely used in various electronic apparatuses. In a horizontal-type MOSFET, a source, a gate and a drain of the transistor are arranged in a direction substantially parallel to the top surface of the substrate. This arrangement results in the device area in the horizontal direction may not be further reduced easily, thereby affecting the integration level of the electronic apparatus and increasing the difficulty of further reducing fabricating costs.

In order to solve the above problems, vertical-type devices have been adopted. In a vertical-type MOSFET, the source, the gate and the drain of the transistor are arranged in a direction substantially perpendicular to the top surface of the substrate, so that the vertical-type device is more easily reduced. However, for a vertical-type device, on the one hand, if a polycrystalline channel material is applied, the channel resistance is greatly increased, so that it is difficult to stack a plurality of vertical-type devices because this causes an excessively high resistance. On the other hand, if a single crystalline channel material is applied, there are some problems, such as, the gate length and the relative positions of the gate and the source/drain are difficult to control. Structural design, material usage, and fabrication accuracy of a semiconductor device directly affect its turn-on and turn-off currents, thereby affecting its performance, such as the power consumption of the semiconductor device.

SUMMARY

In view of the above, an object of the present application is, at least in part, to provide a vertical-type semiconductor device capable of controlling power consumption and leakage current of a semiconductor device, a method of fabricating the same, and an electronic apparatus including the same.

According to a first aspect of the present application, there is provided a semiconductor device comprising: a substrate; a first source/drain layer, a channel layer, and a second source/drain layer sequentially stacked on the substrate and adjacent to each other, a gate stack formed on an outer circumference of the channel layer; wherein at least one interface structure is formed in at least one of the first source/drain layer and the second source/drain layer, the conduction band energy levels at both sides of the interface structure are different and/or the valence band energy levels at both sides of the interface structure are different.

According to a second aspect of the present application, there is provided a method of fabricating a semiconductor device: forming a first source/drain layer on a substrate; forming a channel layer on the first source/drain layer; forming a second source/drain layer on the channel layer; defining an active region of the semiconductor device in the first source/drain layer, the channel layer, and the second source/drain layer; and forming a gate stack on an outer circumference of the channel layer; wherein the steps of forming the first source/drain layer and forming the second source/drain layer further comprise, forming at least one interface structure in at least one of the first source/drain layer and the second source/drain layer, the conduction band energy levels at both sides of the interface structure being different and/or the valence band energy levels at both sides of the interface structure being different.

According to a third aspect of the present application, there is provided an electronic apparatus comprising an integrated circuit formed of the above semiconductor device.

According to an embodiment of the present application, at least one interface structure is formed in at least one of the first source/drain layer and the second source/drain layer of the semiconductor device so that the conduction band energy levels at both sides of the interface structure are different and/or the valence band energy levels at both sides of the interface structure are different, or so that the difference between the conduction band energy levels (or valence band energy levels) of the semiconductor layers located at both sides of the semiconductor interface is greater than or equal to a set threshold, as such, the leakage current of the semiconductor device can be effectively reduced and the performance of semiconductor device is improved. Further, a gate stack formed by epitaxial growth is provided in the semiconductor device, the gate stack surrounding the outer circumference of the channel layer and embedded in a first recess on the channel layer, and at least a portion of the bottom surface or top surface of the gate stack being substantially coplanar with a portion of a top surface of the first source/drain layer or a bottom surface of the second source/drain layer in contact with the channel layer, respectively, thereby enabling good control of the gate length, realizing the self-alignment of the gate stack layer with the source/drain layer, and optimizing the switching performance of the device. In addition, since a second recess recessed inward is formed on the outer circumference of the first source/drain layer and the second source/drain layer, the gate stack is isolated from the first source/drain layer and the second source/drain layer also through the isolation dielectric filled in the second recess when the gate stack is embedded in the first recess, thereby reducing or even avoiding overlap with the source/drain regions, facilitating to reduce the parasitic capacitance between the gate and source/drain.

BRIEF DESCRIPTION OF DRAWINGS

The above and other objects, features and advantages of the present application will become more apparent from the description of the embodiments of the present application with reference to the accompanying drawings hereinafter, in which.

Throughout the drawings, the same or similar reference numerals refer to the same or similar components.

DETAILED DESCRIPTION

Figure 1:
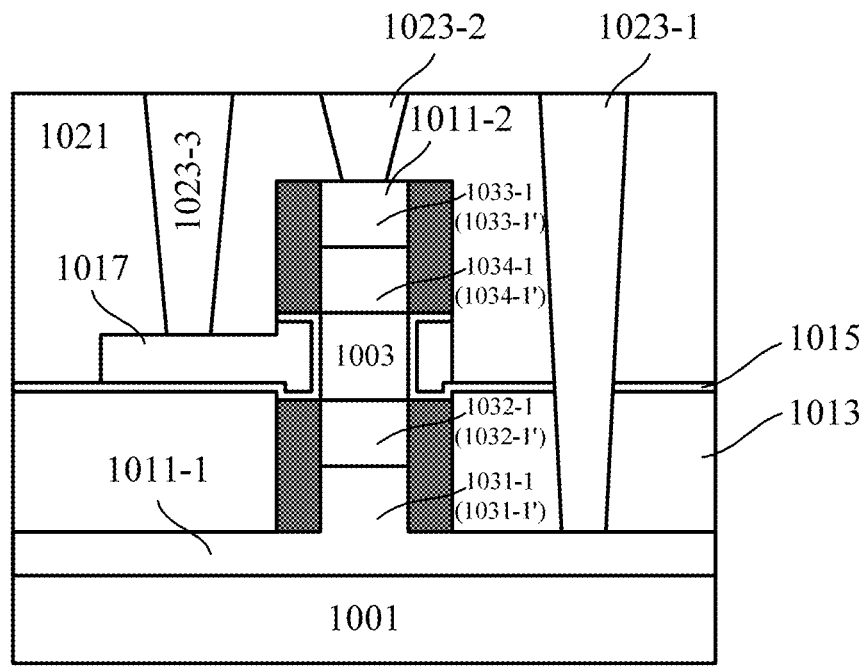
FIGS. 1-3 are schematic diagrams showing a structure of a semiconductor device in accordance with an embodiment of the present application.

Hereinafter, embodiments of the present application will be described with reference to the drawings. However, it should be understood that the description is only illustrative, and is not intended to limit the scope of the application. In addition, description of well-known structures and techniques are omitted in the following description in order to avoid unnecessarily obscuring the concept of the present application.

Various structural schematics in accordance with embodiments of the present application are shown in the drawings. The Figures are not drawn to scale, and some details are exaggerated and some details may be omitted for clarity of illustration. The various regions, the shapes of the layers, and the relative size and position relationship between the layers are merely exemplary, and may vary in practice due to the fabricating tolerance or technical limitation, and those skilled in the art may additionally design regions/layers having different shapes, sizes, and relative positions.

In the context of the present application, when a layer/element is referred to as being "on" another layer/element, the layer/element may be located directly on the other layer/element, or there may be a mediation layer/element between them. In addition, if a layer/element is located "on" another layer/element in one orientation, the layer/element may be located "under" the other layer/element when the orientation is reversed.

FIG. 1 is a schematic diagram showing the structure of a semiconductor device in accordance with an embodiment of the present application. As shown in FIG. 1, a vertical-type semiconductor device according to an embodiment of the present application may include a first source/drain layer 1011-1, a channel layer 1003, and a second source/drain layer 1011-2 sequentially stacked on a substrate 1001 and adjacent to each other. The source/drain region of the device may be formed in the first source/drain layer 1011-1 and the second source/drain layer 1011-2, and a channel region of the device may be formed in the channel layer 1003. A conductive channel may be formed through the channel region between the source/drain regions at two ends of the channel region respectively. A gate stack may be formed surrounding the outer circumference of the channel layer 1003. Thus, the gate length may be determined by the thickness of the channel layer 1003 itself, rather than relying on the time consuming etching as in the prior art, and thus the gate length may be controlled by controlling the thickness of the channel layer 1003. In the following embodiments, it can be seen that, in the present application, the channel layer 1003 may be formed by a growth process such as epitaxial growth, so that the thickness of the channel layer may be well controlled, and therefore, the gate length of the formed device may be well controlled.

According to an embodiment of the present application, at least one interface structure is formed in at least one of the first source/drain layer 1011-1 and the second source/drain layer 1011-2, and the conduction band energy levels at both sides of the interface structure are different and/or the valence band energy levels at both sides of the interface structure are different. As shown in FIG. 1, a schematic diagram of forming an interface structure in each of the first source/drain layer 1011-1 and the second source/drain layer 1011-2 is shown, and the interface structure is formed in a direction parallel to the top surface of the substrate 1001. A first semiconductor layer 1031-1' and a second semiconductor layer 1032-1' are included, in the first source/drain layer 1011-1, in a bottom-up direction perpendicular to the top surface of the substrate 1001. A fourth semiconductor layer 1034-1' and a third semiconductor layer 1033-1' are included, in the second source/drain layer 1011-2, in a bottom-up direction perpendicular to the top surface of the substrate 1001. An interface structure is formed at an interface of the first semiconductor layer 1031-1' and the second semiconductor layer 1032-1', and at an interface of the third semiconductor layer 1033-1' and the fourth semiconductor layer 1034-1', respectively. The conduction band energy levels at the two sides of the interface structure are different and/or the valence band energy levels at both sides of the interface structure are different, that is, the carriers at both sides of the interface structure have different potential energy, and the band structure can reduce or avoid the conventional MOSFET's large leakage current generated by crossing the barrier due to thermal electron emission and improve performance of the device, such as improve sub-threshold swing and reduce power consumption, etc.

Figure 2:
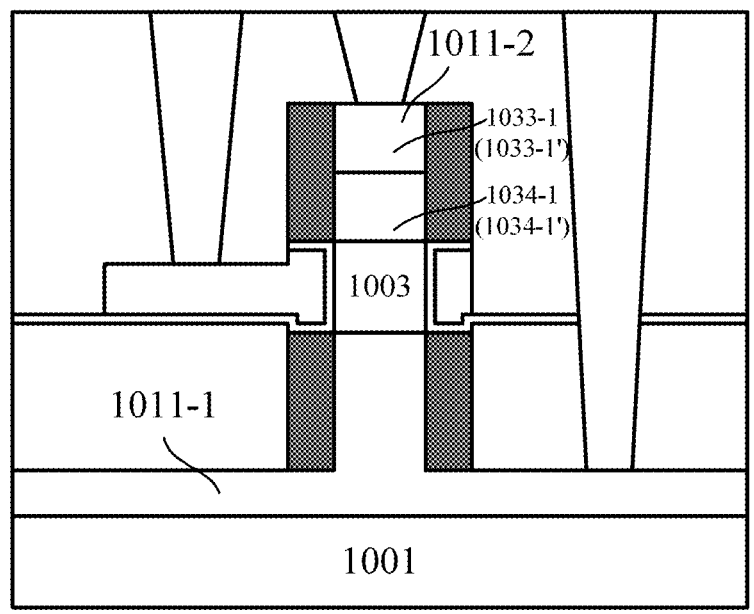

Further, a schematic diagram of forming one (and possibly a plurality of) interface structure only in the second source/drain layer 1011-2 is shown in FIG. 2. As shown in FIG. 2, one interface structure is only formed at the interface of the third semiconductor layer 1033-1' and the fourth semiconductor layer 1034-1' in the second source/drain layer 1011-2. The conduction band energy levels at both sides of the interface structure are different and/or the valence band energy levels at both sides of the interface structure are different, and the carriers at both sides of the interface structure have different potential energy. Therefore, a built-in electric field is formed at both sides of the interface structure, which is beneficial to reduce the turn-off current of the semiconductor device. In other embodiments, one or more interface structures may also be formed only in the first source/drain layer 1011-1.

In a specific embodiment, for a conventional nMOSFET, the pn junction structure is npn, while the pn junction structure of the vertical-type transistor according to the present application is pnpn (a pn junction exists in only one source/drain layer) or pnpnp (pn junctions exist in both the upper and lower source/drain layers). Preferably, for a vertical-type transistor of a pnpn structure, the pn junction located in the source/drain region is p$^+$n (i.e., a pn junction formed by p$^+$ doping and n doping); for a vertical-type transistor of a pnpnp structure, the pn junctions located in the source/drain region are the first and fourth pn junctions, which are p$^+$n and np$^+$ junctions respectively. This structure can reduce or avoid the leakage current generated by the thermal electron emission of the conventional nMOSFET, thereby reducing the power consumption of the device.

Further, it is to be noted that, In another embodiment of the present application, the alternately stacked first semiconductor layers 1031-1' and the second semiconductor layers 1032-1' are not limited to one layer. That is, in the first source/drain layer 1011-1, at least one of the first semiconductor layers (e.g., 1031-1', 1031-2', 1031-3', . . . ) and at least one of the second semiconductor layers (e.g., 1032-1', 1032-2', 1032-3' . . . ) alternately stacked may be included. The interface structure is formed at each correspondingly contacted interface between each of the first semiconductor layers (e.g., 1031-1', 1031-2', 1031-3' . . . ) and each of the second semiconductor layers (e.g., 1032-1', 1032-2', 1032-3' . . . ) respectively, and the conduction band energy levels at both sides of the interface structure are different and/or the valence band energy levels at both sides of the interface structure are different.

Figure 3:
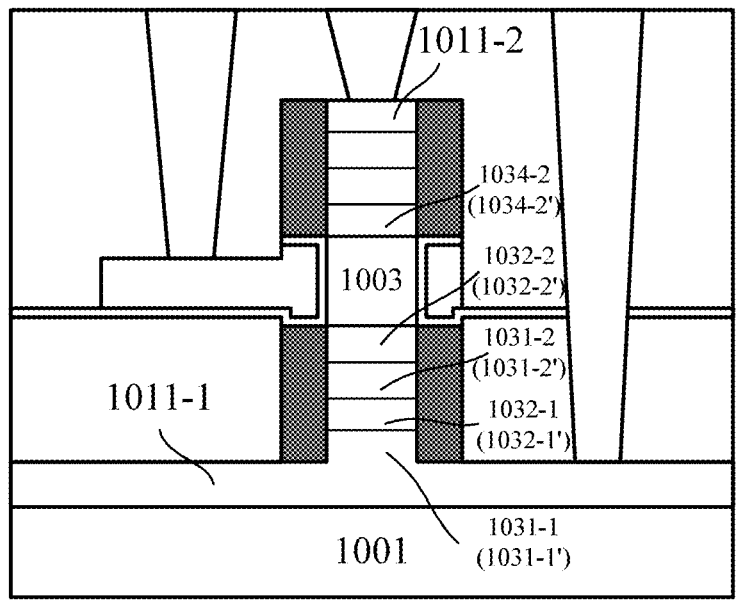

For example, as shown in FIG. 3, four alternately stacked semiconductor layers are respectively formed in the first source/drain layer 1011-1 and the second source/drain layer 1011-2. Taking the first source/drain layer 1011-1 as an example, the first semiconductor layer 1031-1', the second semiconductor layer 1032-1', the first semiconductor layer 1031-2' and the second semiconductor layer 1032-2' are sequentially included in a bottom-up direction perpendicular to the top surface of the substrate 1001. The first semiconductor layers and the second semiconductor layers are alternately stacked. The above interface structure is formed at the interface of the first semiconductor layer 1031-1' and the second semiconductor layer 1032-1' and at the interface of the first semiconductor layer 1031-2' and the second semiconductor layer 1032-2', respectively, that is, two interface structures are formed inside the first source/drain layer 1011-1. In this way, built-in electric fields may be formed at the two interface structures, respectively. Therefore, the leakage current of the device may be controlled by finely adjusting the built-in electric fields to improve the performance of the device. In a specific embodiment, the stacked semiconductor layers may be formed by growing a layer of Si, SiGe or group III-V semiconductor, and the thickness of each semiconductor layer may be controlled within a range of 1 nm to 20 nm. This can satisfy the performance requirements of the device, and also enable the stacking of the devices in the vertical direction. When forming individual semiconductor layers, the conduction band energy level or the valence band energy level of individual semiconductor layers satisfies a certain condition, and thus the electrons in the conduction band at both sides of the interface structure may have different potential energy or the holes in the valence band may have different potential energy.

Specifically, according to the embodiment of the present application, as shown in FIG. 1, at both sides of the interface structure of the first semiconductor layer 1031-1' and the second semiconductor layer 1032-1' in the first source/drain layer 1011-1, and at both sides of the interface structure of the third semiconductor layer 1033-1' and the fourth semiconductor layer 1034-1' in the second source/drain layer 1011-2, the conduction band energy level or the valence band energy level of the first semiconductor layer 1031-1' (or the third semiconductor layer 1033-1') is different from the conduction band energy level or the valence band energy level of the second semiconductor layer 1032-1' (or the fourth semiconductor layer 1034-1') respectively, and the difference between the conduction band energy levels or the valence band energy levels is greater than or equal to a set threshold, such as greater than 0.1 eV. Such an energy band structure can reduce or avoid the conventional MOSFET's large leakage current generated by crossing the barrier due to thermal electron emission and improve performance of the device, such as improve sub-threshold swing, etc.

For example, in a first specific embodiment, the first semiconductor layer is $Al_xGa_{1-x}N$, $0.1<x<0.5$, the second semiconductor layer is GaN; and/or the third semiconductor layer is $Al_xGa_{1-x}N$, $0.1<x<0.5$, the fourth semiconductor layer is GaN. In a second specific embodiment, the first semiconductor layer is $In_xGa_{1-x}As$, $0.3<x<0.7$, the second semiconductor layer is $In_yAl_{1-y}As$, $0.3<y<0.7$; and/or the third semiconductor layer is $In_xGa_{1-x}As$, $0.3<x<0.7$, the fourth semiconductor layer is $In_yAl_{1-y}As$, and $0.3<y<0.7$. In a third specific embodiment, the first semiconductor layer is InP, the second semiconductor layer is $In_zAl_{1-z}As$, $0.3<z<0.7$; and/or the third semiconductor layer is InP, and the fourth semiconductor layer is $In_zAl_{1-z}As$, $0.3<z<0.7$. In a fourth specific embodiment, the first semiconductor layer is $Si_aGe_{1-a}$, the second semiconductor layer is $Si_bGe_{1-b}$, wherein $a \neq b$; and/or the third semiconductor layer is $Si_aGe_{1-a}$, the fourth semiconductor layer is $Si_bGe_{1-b}$, where $a \neq b$).

Further, one or more interface structures may be formed only in the first source/drain layer 1011-1 or only in the second source/drain layer 1011-2. In another embodiment of the present application, the alternately stacked first semiconductor layer 1031-1' and the second semiconductor layer 1032-1' or the third semiconductor layer 1033-1' and the fourth semiconductor layer 1034-1' are not limited to one layer. In case that the conduction band energy level or the valence band energy level of the semiconductor layer satisfies a certain condition so that the conduction band energy levels at both sides of the interface structure are different and/or the valence band energy levels at both sides of the interface structure are different, the present embodiment may be implemented. Reference may be made to FIG. 2, FIG. 3 and the description of the foregoing embodiments, and details are not described herein again.

According to another embodiment of the present application, the interface structure may be a pn junction structure. Specifically, in at least one of the first source/drain layer 1011-1 and the second source/drain layer 1011-2, at least one pn junction structure is formed. Different doped layers are respectively formed in each of the first source/drain layer 1011-1 and the second source/drain layer 1011-2 by doping the respective semiconductor layers differently, and a pn junction structure is formed at the interface between different doped layers. The first source/drain layer 1011-1 and the second source/drain layer 1011-2 may be formed by an epitaxial growth or molecular beam epitaxy (MBE) process. Wherein, the epitaxial growth process is preferably a low temperature epitaxial growth process.

Referring again to FIG. 1, at the interface where the first doped layer 1031-1 and the second doped layer 1032-1 are in contact with each other and at the interface where the third doped layer 1033-1 and the fourth doped layer 1034-1 are in contact with each other, a pn junction structure is formed respectively, which is formed in a direction parallel to the top surface of the substrate 1001.

According to an embodiment of the present application, the first doped layer 1031-1 and the second doped layer 1032-1 are doped layers of opposite polarities. For example, for an n-type MOSFET device, the first doped layer 1031-1 is a positive doped layer (for a p-type MOSFET device, a negative doped layer), and the second doped layer 1032-1 is a negative doped layer (for a p-type MOSFET device, a positive doped layer). Further, the first doped layer 1031-1 may be a $p^+$ doped layer (for a p-type MOSFET device, an $n^+$ doped layer), and the second doped layer 1032-1 may be an n-doped layer (for a p-type MOSFET device, a p-doped layer). The first doped layer 1031-1 and the second doped layer 1032-1 may be in-situ doped layers formed by an in-situ doping process. In other specific embodiments, the doped layer may also be formed by an ion implantation process or a vapor phase drive-in diffusion process. Similarly, for the n-type MOSFET device, the doped layer in the second source/drain layer 1011-2 is formed symmetrically with the doped layer in the first source/drain layer 1011-1 with respect to the channel layer 1003.

According to an embodiment of the present application, the third doped layer 1033-1 and the fourth doped layer 1034-1 are doped layers of opposite polarities. For example, for an n-type MOSFET device, the third doped layer 1033-1 is a positive doped layer (for a p-type MOSFET device, a negative doped layer), and the fourth doped layer 1034-1 is a negative doped layer (for a p-type MOSFET device, a positive doped layer). Further, the third doped layer 1033-1 may be a $p^+$ doped layer (for a p-type MOSFET device, an n+ doped layer), and the fourth doped layer 1034-1 may be an n-doped layer (for a p-type MOSFET, a p-doped layer). The third doped layer 1033-1 and the fourth doped layer 1034-1 may be in-situ doped layers formed by an in-situ doping process. In other specific embodiments, the doped layer may also be formed by an ion implantation process or a vapor phase drive-in diffusion process.

It should be noted that the MOSFET having the mirrored first source/drain layer 1011-1 and the second source/drain layer 1011-2 is a symmetric semiconductor device, but In another embodiment of the present application, different semiconductor materials may also be adopted to dope the first doped layers and the second doped layers stacked in different positions in the first source/drain layer to form an asymmetric semiconductor device. For example, when the first source/drain layer 1011-1 includes two first doped layers and two second doped layers, the two first doped layers may be doped with different materials respectively, and the two second doped layers may be doped with different materials respectively. In case that the requirements for forming a pn junction structure between the adjacent first doped layer and the second doped layer can be satisfied, they all can be used for implementation of the embodiments of the present application. The present application is not limited hereto.

According to the semiconductor device of the embodiment of the present application, since a pn junction structure is formed in the first source/drain layer 1011-1 and the second source/drain layer 1011-2 respectively, when an operating voltage is applied to the semiconductor device, the additional pn junction structure may adjust the electric field inside the semiconductor device, thereby improving the performance of the semiconductor device. The internally formed electric field may reduce the leakage current of the device while reducing the influence of the sub-threshold swing on the device and increasing the ratio of the ON current to the OFF current of the semiconductor device.

In addition, it should be noted that, in another embodiment of the present application, the first doped layer 1031-1 and the second doped layer 1032-1 which are alternately stacked are not limited to one layer. The third doped layer 1033-1 and the fourth doped layer 1034-1 which are alternately stacked are not limited to one layer. For example, at least one of the first doped layers (e.g., 1031-1, 1031-2, 1031-3, . . . ) and at least one of the second doped layers (e.g., 1032-1, 1032-2, 1032-3, . . . ) alternately stacked may be included in the first source/drain layer 1011-1. A plurality of pn junction structures are respectively formed at each correspondingly contacted interface between the first semiconductor layers (e.g., 1031-1, 1031-2, 1031-3, . . . ) and the second semiconductor layers (e.g., 1032-1, 1032-2, 1032-3, . . . ).

According to an embodiment of the present application, an active region of the device may be defined in the alternately stacked first source/drain layer 1011-1, the channel layer 1003, and the second source/drain layer 1011-2. For example, they can be selectively etched into a desired shape sequentially. Generally, the active region may be columnar and may have a circular or rectangular cross section. When the cross section thereof is circular, the radius of the circle may preferably be 5 nm to 100 nm. When the cross section thereof is rectangular, it may be a rectangle having a width of 10 nm to 100 nm (in a direction perpendicular to the plane of the paper) and a length of 10 nm to 10 μm (in a direction parallel to the top surface of the substrate 1001). Such a structure not only provides sufficient device current, but also better controls short channel effects.

It can also be seen from FIG. 1 that only the upper portion of the first source/drain layer 1011-1 is etched, and the lower portion of the first source/drain layer 1011-1 can extend beyond the outer circumference of the upper portion thereof, which may facilitate connecting source/drain regions formed in the first source/drain layer in a subsequent process. Then, a gate stack may be formed around the outer circumference of the channel layer 1003. The gate stack includes a gate dielectric layer 1015, a Vt tuning metal (which is sandwiched between the gate dielectric layer and a gate conductor layer, typically also a metal layer), and the gate conductor layer 1017. The outer circumference of the channel layer 1003 may be recessed inwardly with respect to the outer circumference of the columnar active region to form a first recess. In this way, the formed gate stack may be embedded in the first recess, and in the process of forming the gate stack, self-alignment may be performed by using the first recess, which ensures processing precision to some extent.

Further, at least a portion of the bottom surface of the formed gate stack is substantially coplanar with at least a portion of the top surface of the second doped layer (in FIG. 1, the doped layer is 1032-1; and in FIG. 3, the doped layer is 1032-2) or the second semiconductor layer (in FIG. 1, the semiconductor layer is 1032-1'; and in FIG. 3, the semiconductor layer is 1032-2') in contact with the channel layer 1003; and/or at least a portion of a top surface of the gate stack is substantially coplanar with at least a portion of the bottom surface of the fourth doped layer (in FIG. 1, the doped layer is 1034-1; and in FIG. 3, the doped layer is 1034-2) or the fourth semiconductor layer (in the FIG. 1, the semiconductor layer is 1034-1'; and in FIG. 3, the semiconductor layer is 1034-2') in contact with the channel layer 1003. This structure can increase the ON-state current of the device, improve the short channel effect of the device, and reduce process fluctuations in device fabrication.

According to an embodiment of the present application, the first source/drain layer 1011-1 and the second source/drain layer 1011-2 are recessed inwardly with respect to the outer circumference of the columnar active region to form a second recess. An isolation medium is filled in the second recess. The isolation medium may include, for example, SiN, $Si_3N_4$, $SiO_2$, SiCO, and the like. As can be seen from FIG. 1, the filled isolation medium is located at the gate stack portion embedded in the first recess, thereby avoiding overlap between the gate stack and the first source/drain layer 1011-1 and the second source/drain layer 1011-2. This facilitates reducing the parasitic capacitance between the gate and source/drain to improve device performance.

According to an embodiment of the present application, the channel layer 1003 may be composed of a single crystal semiconductor material, and the channel layer 1003 may include a semiconductor material different from that of the first source/drain layer 1011-1 and the second source/drain layer 1011-2. Specifically, the semiconductor material of the channel layer 1003 is different from the semiconductor material of at least one of the second doped layers or the semiconductor material of at least one of the second semiconductor layers, and/or the semiconductor material of the channel layer 1003 is different from the semiconductor material of at least one of the four doped layers or the semiconductor material of at least one of the fourth semiconductor layer. Thus, it is advantageous to process the channel layer 1003, such as selectively etching the channel layer 1003 to form the first and the second recesses respectively. The channel layer 1003 may be formed by an epitaxial growth process or a molecular beam epitaxy (MBE) process. Wherein, the epitaxial growth process is preferably a low temperature epitaxial growth process.

It can also be seen from FIG. 1 that the semiconductor device further includes via holes respectively exposing the gate stack, the first source/drain layer 1011-1 and the second source/drain layer 1011-2, each of which is formed with a contact portion 1023-3 connecting the gate stack, a contact portion 1023-1 connecting the first source/drain layer 1011-1, and a contact portion 1023-2 connecting the second source/drain layer 1011-2. Further, on the top surface of the lower region of the first source/drain layer 1011-1 beyond the outer circumference of the upper portion thereof, an isolation layer 1013 is further formed. The top surface of the isolation layer 1013 is adjacent to the top surface of the first source/drain layer 1011-1 located inside the columnar active region or between the top surface and the bottom surface of the channel layer 1003, and the isolation layer 1013 may, together with the first recess, achieve self-alignment of the gate stack during processing, which will be described in detail hereafter. An interlayer dielectric layer 1021 is also formed at the top of the MOSFET structure for isolation and protection of the device.

The application can be presented in various forms, some of which are described below.

FIGS. 4 to 12 illustrate a flow chart for fabricating a semiconductor device in accordance with an embodiment of the present application, in which the n-type MOSFET device with a pn junction structure formed symmetrically and respectively in the first source/drain layer and the second source/drain layer will be described as an example.

Figure 4:
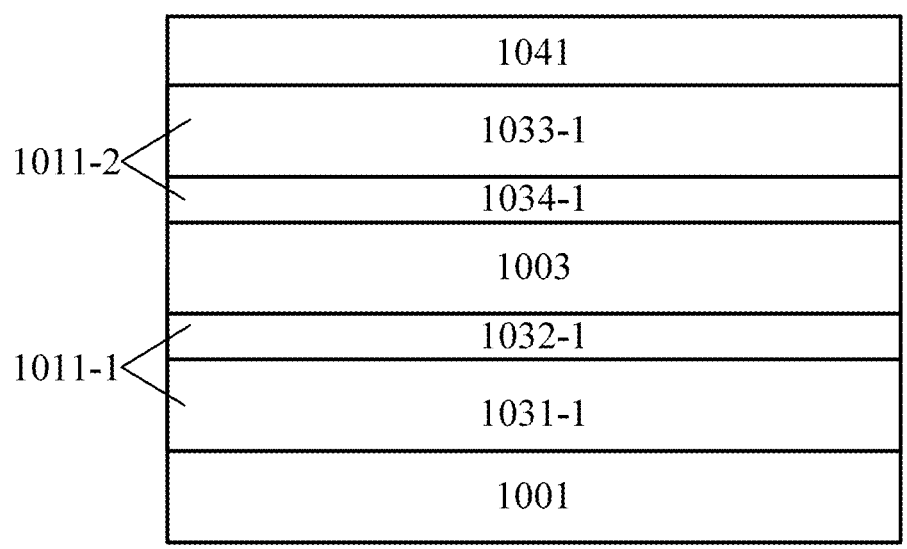
FIGS. 4-12 are schematic diagrams showing a flow of fabricating a semiconductor device in accordance with an embodiment of the present application.

As shown in FIG. 4, a substrate 1001 is provided. The substrate 1001 may be various forms of substrates including, but not limited to, a bulk semiconductor material substrate such as a bulk Si substrate, a semiconductor-on-insulator (SOI) substrate, a compound semiconductor substrate such as a SiGe substrate, and the like. In the following description, a bulk Si substrate will be described as an example for convenience of explanation.

On the substrate 1001, a first source/drain layer 1011-1, a channel layer 1003, and a second source/drain layer 1011-2 may be sequentially formed. In a specific embodiment, the above layers may be sequentially formed by epitaxial growth, including: firstly, the first source/drain layer 1011-1 is formed on the substrate 1001. Taking the first source/drain layer 1011-1 including a first doped layer 1031-1 and a second doped layer 1032-1 as an example, it is necessary to sequentially form an alternately stacked first doped layer 1031-1 and second doped layer 1032-1 on the substrate 1001 by epitaxial growth. The first doped layer 1031-1 may be an in-situ doped Si layer. For example, for an n-type MOSFET device, it is preferable that the doping material is B, the doping concentration is about $1E19$ $cm^{-3}$ to $1E21$ $cm^{-3}$, and the thickness of the first doped layer 1031-1 is about 10 nm to 100 nm. The second doped layer 1032-1 may also be an in-situ doped Si layer. For example, for an n-type MOSFET device, it is preferable that the doping material is P or As, the doping concentration is about $1E18$ $cm^{-3}$ to $1E21$ $cm^{-3}$, and the thickness of the second doped layer 1032-1 is about 1 nm to 15 nm. Then, a channel layer 1003 is formed by epitaxial growth on the first source/drain layer 1011-1 (i.e., on the second doped layer 1032-1), and the channel layer 1003 may be a SiGe layer having a thickness of about 10 nm to 100 nm. This thickness is used to define the gate length. Next, the second source/drain layer 1011-2 is formed on the channel layer 1003. Taking the second source/drain layer 1011-2 including the third doped layer 1033-1 and the fourth doped layer 1034-1 as an example, it is necessary to sequentially form an alternately stacked fourth doped layer 1034-1 and third doped layer 1033-1 on the channel layer 1003 by epitaxial growth. The third doped layer 1033-1 may be an in-situ doped Si layer. For example, for an n-type MOSFET device, it is preferable that the doping material is B, the doping concentration is about $1E19$ $cm^{-3}$ to $1E21$ $cm^{-3}$, and the thickness of the third doped layer 1033-1 is about 10 nm to 100 nm. The fourth doped layer 1034-1 may also be an in-situ doped Si layer. For example, for an n-type MOSFET device, it is preferable that the doping material is P or As, the doping concentration is about $1E18$ $cm^{-3}$ to $1E21$ $cm^{-3}$, and the thickness of the fourth doped layer 1034-1 is about 1 nm to 15 nm. The present application is not limited thereto, and the kind of the above doping material, the doping concentration, and the thickness of the doped layer may be changed.

In the embodiment of the present application, it is preferably formed by an epitaxial growth process or a molecular beam epitaxy process. The epitaxial growth process preferably uses a low temperature epitaxial growth process, and the process temperature is less than 800° C., so that large diffusion of dopants can be avoided. By forming the stacked semiconductor layers through an epitaxial growth process, the thickness of the semiconductor layer can be well controlled. Since the gate length of the semiconductor device is determined by the thickness of the channel layer 1003, the gate length can be controlled more accurately.

In the embodiment of the present application, in addition to the in-situ doping method to form the doped layer, other doping processes such as an ion implantation process or a vapor phase drive-in diffusion process may be used. When the doped layer is formed, semiconductor material layers (for example, Si in the first doped layer 1031-1, the second doped layer 1032-1, the third doped layer 1033-1, and the fourth doped layer 1034-1) are separately formed by deposition, and then doped with other materials by in-situ doping, ion implantation process or gas phase drive-in diffusion process.

The channel layer 1003 may be formed by an epitaxial growth process over the first source/drain layer 1011-1 (i.e., the second doped layer 1032-1). In the embodiment of the present application, the channel layer 1003 may employ a single crystal semiconductor material, which is advantageous in reducing the resistance of the device. And the single crystal semiconductor material of the channel layer 1003 may have the same crystal structure as the semiconductor materials of the first source/drain layer 1011-1 and the second source/drain layer 1011-2. For example, in a specific embodiment, channel layer 1003 can be an in-situ doped SiGe.

It should be noted that, in order to ensure the subsequent process (for example, forming the first recess and the second recess), it should ensure the materials of the channel layer 1003, the first source/drain layer 1011-1, the second source/drain layer 1011-2 and the substrates 1001 has etch selectivity. In addition, in some other embodiments, an oxide is also deposited on the third doped layer 1033-1 to form a hard mask 1041, and the hard mask 1041 can be used to define a shape of the isolation of the first source/drain layer 1011-1 and the second source/drain layer 1011-2 when the isolation between the first source/drain layer and the second source/drain layer 1011-2 are formed/etched.

Figure 5A:
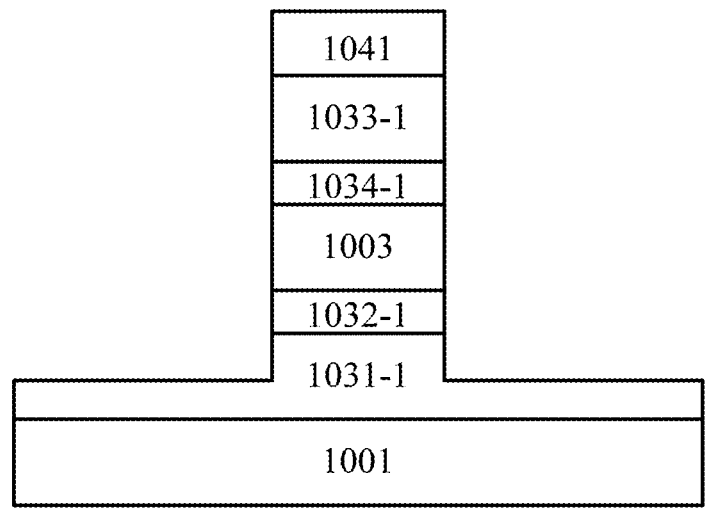
Figure 5B:
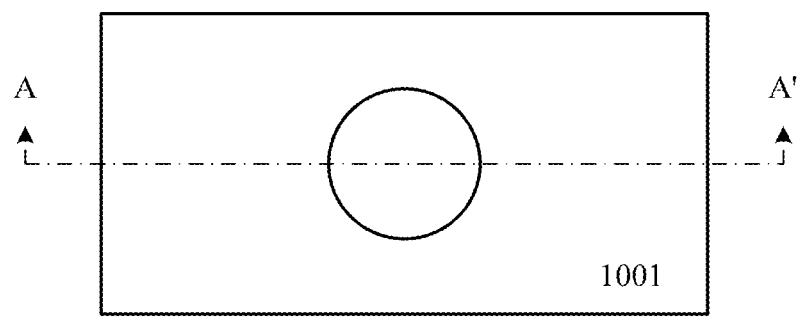

Next, the active region of the device can be defined. Specifically, as shown in FIGS. 5a and 5b (wherein FIG. 5a is a cross-sectional view, FIG. 5b is a top view, and line AA' shows the cut-out position of the cross-section), a photoresist (not shown) is formed on the stack of the substrate 1001, the channel layer 1003, the first source/drain layer 1011-1 (including the first doped layer 1031-1 and the second doped layer 1032-1), and the second source/drain layer 1011-2 (including the third doped layer 1033-1 and the fourth doped layer 1034-1) and the hard mask 1041 shown in FIG. 4, and the photoresist is patterned into a desired shape by photolithography (exposure and development), and the hard mask 1041, the third doped layer 1033-1, the fourth doped layer 1034-1, the channel layer 1003, the second doped layer 1032-1, and the first doped layer 1031-1 are selectively etched (for example, reactive ion etching (RIE)) sequentially with the patterned photoresist as a mask. The etching proceeds into the first doped layer 1031-1, but does not proceed to the bottom surface of the first doped layer 1031-1, that is, does not etch to the top surface of the substrate 1001. The upper portion of the etched hard mask 1041, the third doped layer 1033-1, the fourth doped layer 1034-1, the channel layer 1003, the second doped layer 1032-1, and the first doped layer 1031-1 is formed in a columnar shape. The RIE can be performed, for example, in a direction substantially perpendicular to the surface of the substrate such that the pillars are also substantially perpendicular to the surface of the substrate. After that, the photoresist may be removed.

As can be seen from the top view of FIG. 5b, in this embodiment, the cross section of the active region is substantially circular, that is, the outer circumference of the active region is substantially cylindrical, and the radius of the circular cross section is preferably 10 nm to 100 nm. In other embodiments, when the cross section of the active region is rectangular, the length of the rectangle (in the direction parallel to the top surface of the substrate 1001 in FIG. 5a) may preferably be 10 nm to 10 µm in order to provide a sufficient device current, preferably, the rectangular has a width of 10 nm to 100 nm (in FIG. 5a, in a direction perpendicular to the plane of the paper) to better control the short channel effect. Of course, the shape of the active region is not limited thereto, and other shapes may be formed according to the design layout. For example, the cross section of the active region may be elliptical, square, or the like.

Figure 6:
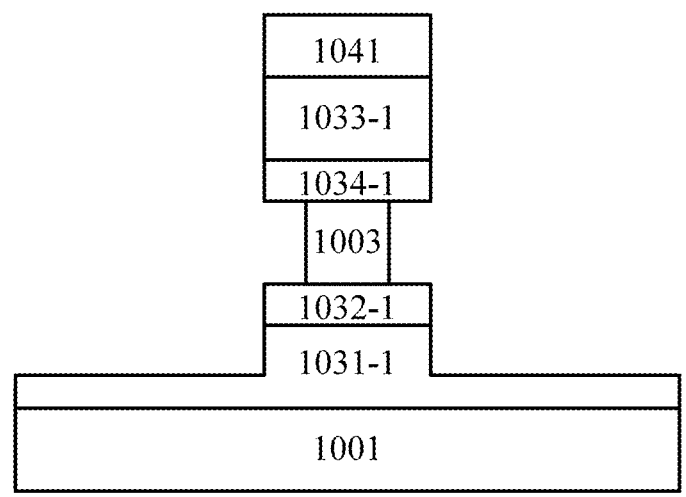

Then, as shown in FIG. 6, a first recess is formed in the channel layer 1003, that is, the outer circumference of the channel layer 1003 is recessed with respect to the outer circumference of the formed columnar active region (or the outer circumference of the hard mask 1041). (In this example, it is recessed in a lateral direction substantially parallel to the surface of the substrate). For example, this can be achieved by further selectively etching the channel layer 1003 with respect to the substrate 1001, the first source/drain layer 1011-1, the second source/drain layer 1011-2, and the hard mask 1041.

In a specific embodiment, a method of selectively etching based on a modifier is employed. Specifically, firstly, the stack structure formed in the foregoing process is entirely placed in a surface modifier, and the modifier may include a liquid or aqueous solution, an oxygen-containing gas or an oxygen-containing plasma formed of one of or a combination of ozone ($O_3$), potassium permanganate ($KMnO_4$), potassium dichromate ($K_2Cr_2O_7$), nitric acid ($HNO_3$), sulfuric acid ($H_2SO_4$), hydrogen peroxide ($H_2O_2$). By the reaction between the modifier and the semiconductor material, a modified layer in the form of an oxide (for example, SiGeO formed at the surface of the SiGe) is formed at the surface of the substrate 1001, the channel layer 1003, the first source/drain layer 1011-1 (including the first doped layer 1031-1 and the second doped layer 1032-1), the second source/drain layer 1011-2 (including the third doped layer 1033-1 and the fourth doped layer 1034-1) and the hard mask 1041. Generally, the surface of the semiconductor on which the modified layer is formed is also cleaned after the formation of the modified layer. Then, the modified layer is removed with an etchant and the semiconductor surface is cleaned after the modified layer is removed. The etchant used may include hydrofluoric acid, buffered hydrofluoric acid, BOE, hydrofluoric acid vapor, halogenated hydride or steam thereof. The cleaning agent used may include water, high purity deionized water, ethanol, acetone, and the like. Then, it is checked whether the preset depth is etched. If the preset depth is not reached, the above-mentioned process steps of forming a modified layer by using a modifier and etching the modified layer are repeated until the etching requirement is reached. The method can accurately control the etching thickness (≤0.5 nm) during semiconductor processing, and can increase the etching rate.

Figure 7:
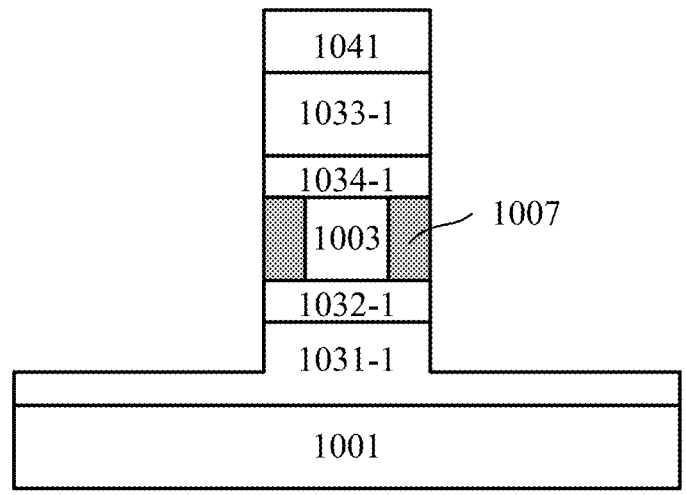

Next, as shown in FIG. 7, a material layer, called a sacrificial layer 1007 (also referred to be a sacrificial gate), is filled in the first recess. The sacrificial layer is primarily used to avoid subsequent processing from affecting the channel layer 1003 or leaving unnecessary material in the first recess to affect the subsequent formation of the gate stack. In a specific embodiment, a nitride may be filled into the first recess, which can be achieved by depositing a nitride on the structure shown in FIG. 6, and then etching back the deposited nitride such as RIE. The direction of etching back is substantially perpendicular to the direction of the top surface of the substrate 1001. The filled nitride mainly occupies a space of a gate stack to be formed in a subsequent process, and the outer circumference surface of the sacrificial layer 1007 is substantially coplanar with the outer circumference surface of the columnar active region.

Next, a second recess is formed at an upper portion of the first source/drain layer 1011-1 (i.e., a portion of the first source/drain layer 1011-1 included in the columnar active region) and the second source/drain layer 1011-2. That is, the outer circumference of the upper portion of the first source/drain layer 1011-1 and the second source/drain layer 1011-2 are recessed (in this example, recessed in a lateral direction substantially parallel to the surface of the substrate) with respect to the outer circumference of the formed columnar active region (or the outer circumference of the hard mask 1041, or the outer circumference of the formed sacrificial layer 1007). For example, this can be achieved by further selectively etching the upper portion of the first source/drain layer 1011-1 and the second source/drain layer 1011-2 with respect to the substrate 1001, the sacrificial layer 1007, and the hard mask 1041.

Figure 8:
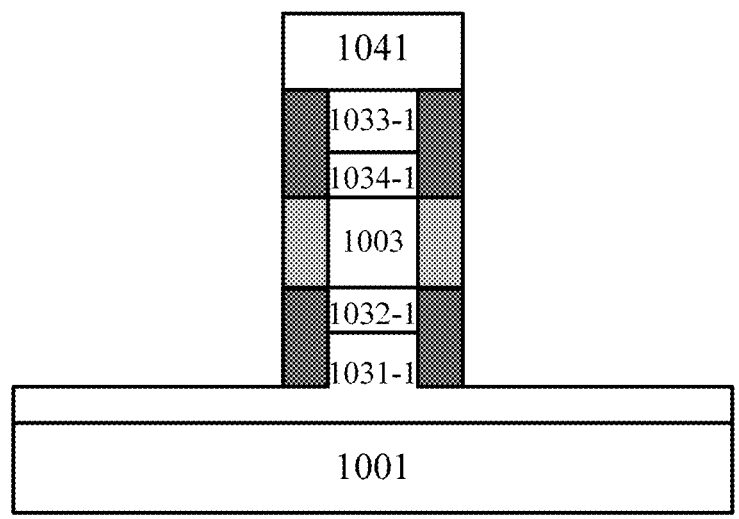

In a specific embodiment, a method of selective etching based on a modifier is still employed. The implementation steps can be carried out with reference to the process steps used to form the first recess, and are not described herein again. After the second recess is formed, the isolation medium is filled in the second recess. In a specific embodiment, the isolation medium may be SiN, $Si_3N_4$, $SiO_2$, SiCO, and the like. Due to the presence of the isolation medium, when the gate stack is embedded in the first recess, it can be isolated from the first source/drain layer and the second source/drain layer also by the isolation medium filled in the second recess, thereby reducing or even avoiding overlap with source/drain regions to facilitate the reduction of the parasitic capacitance between the gate and source/drain. The outer circumference surface of the isolation medium after filling the isolation medium is substantially coplanar with the outer circumference surface of the sacrificial layer 1007, as shown in FIG. 8.

Figure 9:
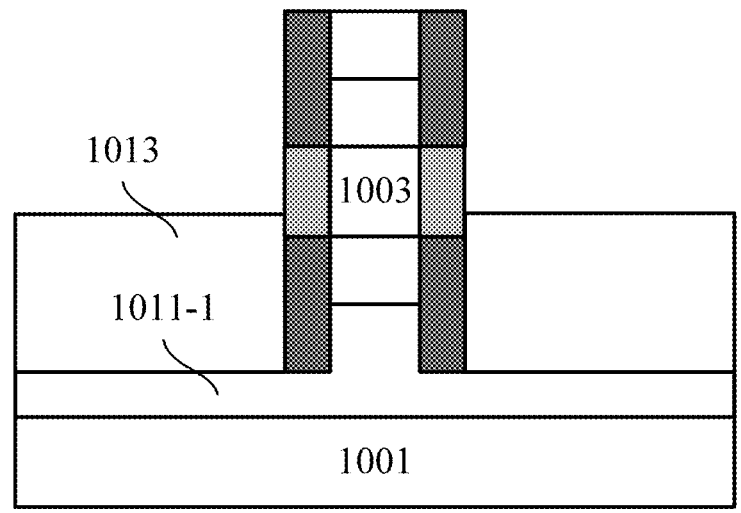

Next, an isolation layer may be formed around the active region to achieve electrical isolation. For example, as shown in FIG. 9, an oxide may be deposited on the top surface of the portion of the first source/drain layer 1011-1 beyond the columnar active region, and etched back to form the isolation layer 1013. The deposited oxide may be planarization processed such as chemical mechanical polishing (CMP) or sputtering before etched back. In the embodiments of the present application, the top surface of the formed isolation layer (note that the hard mask 1041 is etched away together during etching back oxidation) 1013 may be close to the top surface of the upper portion of the first source/drain layer 1011-1 or between the top surface and the bottom surface of the channel layer 1003.

When the isolation layer is formed, the sacrificial layer 1007 may be preserved to prevent the material of the isolation layer from entering the first recess that is used to accommodate the gate stack. Thereafter, the sacrificial layer 1007 may be removed to release the space in the first recess. For example, the sacrificial layer 1007 (nitride) may be selectively etched with respect to the isolation layer 1013 (oxide) and the first source/drain layer 1011-1 (in-situ doped Si), the isolation medium (oxide or nitride of Si), and the channel layer 1003 (SiGe).

Figure 10:
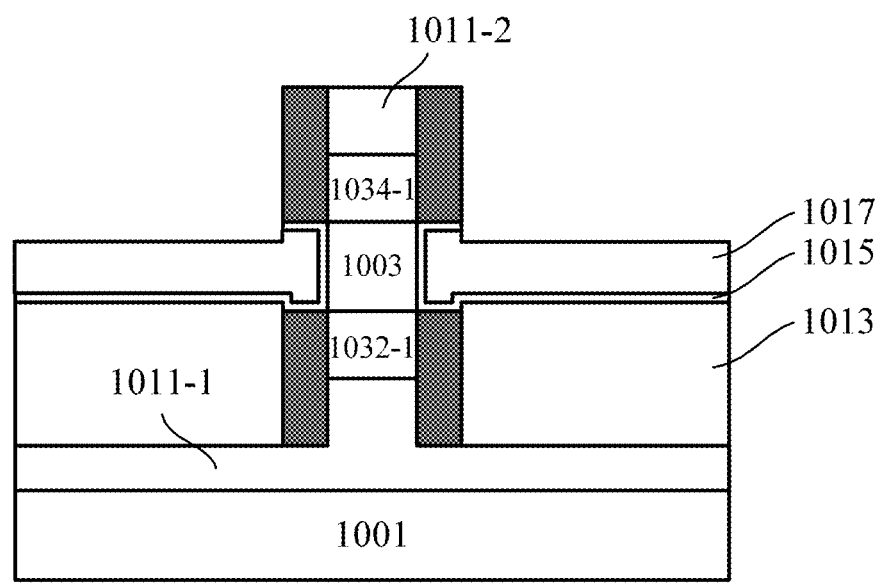

Then, as shown in FIG. 10, a gate stack may be formed in the first recess. Specifically, a gate dielectric layer 1015 and a gate conductor layer 1017 may be sequentially deposited on the structure (wherein the sacrificial layer 1007 is removed) shown in FIG. 9, and the gate dielectric layer 1015 may include, for example, an interface layer and a high-k gate dielectric such as $SiO_2$ and $HfO_2$. The gate conductor layer 1017 may, for example, comprise a metal gate conductor. In addition, a work function adjustment layer may also be formed between the gate dielectric layer 1015 and the gate conductor layer 1017.

Then, the deposited gate conductor layer 1017 (and optionally the gate dielectric layer 1015) is etched back such that at least a portion of the bottom surface of the gate stack (e.g., the bottom surface of the portion inside the first recess) is substantially coplanar with at least a portion of the top surface of the first source/drain layer 1011-1 in contact with the channel layer 1003, referring to FIG. 10, that is, inside the first recess, the bottom surface of the gate dielectric layer 1015 of the gate stack is substantially coplanar with the top surface of the second doped layer 1032-1 of the first source/drain layer 1011-1; and/or such that at least a portion of the top surface of the gate stack (e.g., a top surface of a portion inside the first recess) is substantially coplanar with at least a portion of the bottom surface of the second source/drain layer 1011-2 in contact with the channel layer 1003. Referring to FIG. 10, that is, the top surface of the gate conductor layer 1017 of the gate stack inside the first recess is substantially coplanar with the bottom surface of the fourth doped layer 1034-1 of the second source/drain layer 1011-2.

In this way, the gate stack can be embedded in the first recess to overlap with the channel layer 1003 in the entire height. At the position facing the gate stack embedded in the first recess, is an isolation medium filled in the second recess, thereby avoiding overlap between the gate stack and the source/drain regions, thereby reducing the parasitic capacitance between the gate and source/drain. In addition, since self-alignment is realized by the first recess in the process of forming the gate stack, the processing accuracy can be improved.

Figure 11:
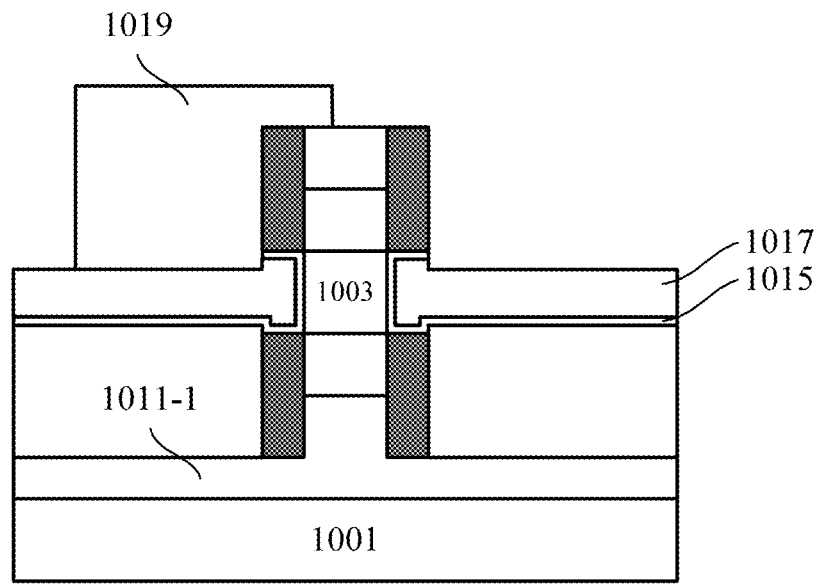

Next, the shape of the gate stack may be adjusted to facilitate subsequent interconnect fabrication. For example, as shown in FIG. 11, a photoresist 1019 can be formed on the structure shown in FIG. 10. The photoresist 1019 is patterned, for example, by photolithography, to cover a portion of the gate stack exposed outside the first recess (in this example, the left half of the figure), and to expose another portion of the gate stack exposed outside the first recess (in this example, the right half of the figure).

Then, the gate conductor layer 1017 can be selectively etched, such as RIE, using the photoresist 1019 as a mask. Thus, besides the portion remaining inside the first recess, the portion of the gate conductor layer 1017 that is shielded by the photoresist 1019 is retained. The electrical connection to the gate stack can then be achieved by this portion. Thereafter, the photoresist 1019 is removed as shown in FIG. 12.

Figure 12:
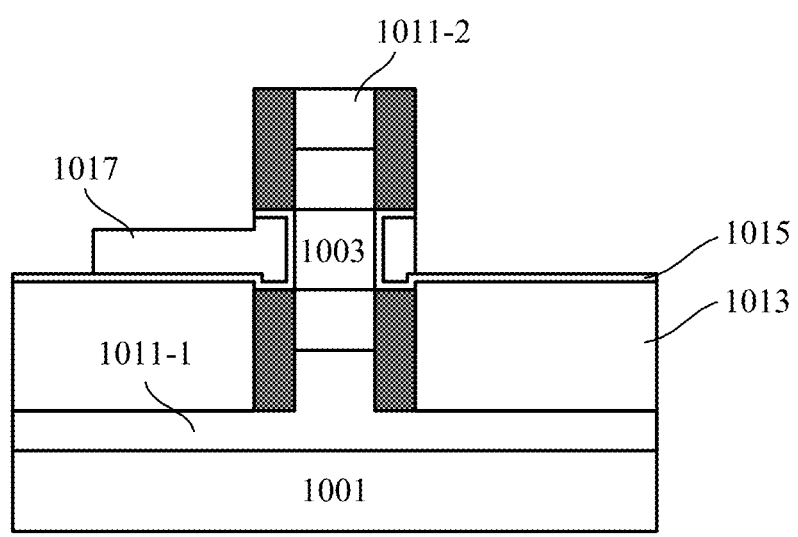

Next, referring back to FIG. 1, an interlayer dielectric layer 1021 is formed on the structure shown in FIG. 12. For example, an oxide may be deposited and planarized, such as CMP, to form the interlayer dielectric layer 1021. In the interlayer dielectric layer 1021, a contact portion 1023-1 to the region of the first source/drain layer 1011-1 (i.e., source/drain region), a contact portion 1023-2 to the region of the second source/drain layer 1011-2 (i.e., source/drain region), and a contact portion 1023-3 to the gate conductor layer 1017 may be formed, respectively. These contact portions may be formed by forming a via hole through etching in the interlayer dielectric layer 1021 and the isolation layer 1013 and filling a conductive material such as a metal therein.

Since the gate conductor layer 1017 extends beyond the outer circumference of the active region, so that its contact portion 1023-3 can be easily formed. In addition, since the lower portion of the first source/drain layer 1011-1 extends beyond the outer circumference of the columnar active region, that is, there is no gate conductor layer on at least a portion of the first source/drain layer 1011-1, thereby forming its contact portion 1023-1 easily.

The semiconductor device according to the embodiments of the present application can be applied to various electronic apparatuses. For example, by integrating a plurality of such semiconductor devices and other devices (e.g., other forms of transistors, etc.), an integrated circuit (IC) may be formed, thereby constituting the electronic apparatus. Accordingly, the present application also provides an electronic apparatus including the above semiconductor devices. The electronic apparatus may also include a display screen that works with the integrated circuit and a wireless transceiver or the like that works with the integrated circuit. Such electronic apparatus is, for example, a smart phone, a computer, a tablet computer (PC), a wearable smart device, a mobile power supply, or the like.

In the above description, detailed descriptions of the technical details such as patterning and etching of the respective layers have not been made. However, it will be understood by those skilled in the art that layers, regions, and the like of a desired shape can be formed by various technical means. In addition, in order to form the same structure, those skilled in the art can also design a method that is not exactly the same as the method described above. In addition, although the respective embodiments have been described above, this does not mean that the measures in the respective embodiments cannot be used in combination advantageously.

The embodiments of the present application have been described above. However, these examples are for illustrative purposes only and are not intended to limit the scope of the application. The scope of the present application is defined by the appended claims and their equivalents. Numerous alternatives and modifications can be made by those skilled in the art without departing from the scope of the present application, and such alternatives and modifications are intended to fall within the scope of the present application.

The invention claimed is:

1. A semiconductor device, comprising:
    a substrate;
    a first source/drain layer, a channel layer, and a second source/drain layer sequentially stacked on the substrate and adjacent to each other, and a gate stack formed around an outer circumference of the channel layer;
    wherein at least one interface structure is formed in each of the first source/drain layer and the second source/drain layer, conduction band energy levels at both sides of the interface structure are different and/or valence band energy levels at both sides of the interface structure are different.

2. The semiconductor device according to claim 1, wherein the at least one interface structure is formed in a direction parallel to a top surface of the substrate.

3. The semiconductor device according to claim 2, wherein the first source/drain layer comprises at least one of first semiconductor layers and at least one of second semiconductor layers alternately stacked in a bottom-up direction perpendicular to the top surface of the substrate, and the interface structure is formed between the first semiconductor layer and the second semiconductor layer.

4. The semiconductor device according to claim 2, wherein the second source/drain layer comprises at least one of fourth semiconductor layers and at least one of third semiconductor layers alternately stacked in a bottom-up direction perpendicular to a top surface of the substrate, and the interface structure is formed between the fourth semiconductor layer and the third semiconductor layer.

5. The semiconductor device according to claim 4, wherein
    a conduction band energy level or a valence band energy level of the first semiconductor layer is different from a conduction band energy level or a valence band energy level of the second semiconductor layer, and the difference between the conduction band energy levels or between the valence band energy levels is greater than or equal to the set threshold; and/or
    a conduction band energy level or a valence band energy level of the third semiconductor layer is different from a conduction band energy level or a valence band energy level of the fourth semiconductor layer, and the difference between the conduction band energy levels or between the valence band energy levels is greater than or equal to the set threshold.

6. The semiconductor device according to claim 5, wherein
    the first semiconductor layer is $Al_xGa_{1-x}N$, $In_xGa_{1-x}As$, InP or $Si_aGe_{1-a}$, $0.1<x<0.7$, and the second semiconductor layer is GaN, $In_yAl_{1-y}As$, $In_yAl_{1-y}As$ or $Si_bGe_{1-b}$, $0.3<y<0.7$, where $a \neq b$; and/or
    the third semiconductor layer is $Al_xGa_{1-x}N$, $In_xGa_{1-x}As$, InP or $Si_aGe_{1-a}$, $0.1<x<0.7$, and the fourth semiconductor layer is GaN, $In_yAl_{1-y}As$, $In_yAl_{1-y}As$ or $Si_bGe_{1-b}$, $0.3<y<0.7$, where $a \neq b$.

7. The semiconductor device according to claim 2, wherein the at least one interface structure is a pn junction.

8. The semiconductor device according to claim 7, wherein the first source/drain layer comprises at least one of first doped layers and at least one of second doped layers alternately stacked in a bottom-up direction perpendicular to the top surface of the substrate; and the pn junction is formed between the first doped layer and the second doped layer.

9. The semiconductor device according to claim 7, wherein the second source/drain layer comprises at least one of fourth doped layers and at least one of third doped layers alternately stacked in a bottom-up direction perpendicular to the top surface of the substrate; and the pn junction is formed between the fourth doped layer and the third doped layer.

10. The semiconductor device according to claim 9, wherein a semiconductor material of the channel layer is different from a semiconductor material of the at least one of second doped layers or a semiconductor material of the at least one of second semiconductor layers; and/or the semiconductor material of the channel layer is different from a semiconductor material of the at least one of fourth doped layers or a semiconductor material of the at least one of fourth semiconductor layers.

11. The semiconductor device according to claim 10, wherein
    at least a portion of a bottom surface of the gate stack is substantially coplanar with at least a portion of a top surface of the second doped layer or second semiconductor layer in contact with the channel layer; and/or
    at least a portion of a top surface of the gate stack is substantially coplanar with at least a portion of a bottom surface of the fourth doped layer or fourth semiconductor layer in contact with the channel layer.

12. The semiconductor device according to claim 1, wherein the channel layer comprises a channel layer single crystal semiconductor material, and wherein the channel layer single crystal semiconductor material has the same crystal structure as the semiconductor materials of the first source/drain layer and the second source/drain layer.

13. The semiconductor device according to claim 12, wherein the channel layer comprises SiGe or in-situ doped SiGe.

14. The semiconductor device according to claim 13, wherein the first source/drain layer, the channel layer, and the second source/drain layer are formed by an epitaxial growth process or a molecular beam epitaxial process.

15. The semiconductor device according to claim 13, wherein doping of the first source/drain layer, the channel layer, and the second source/drain layer is formed by in-situ doping, ion implantation process, or gas phase drive-in diffusion process.

16. An electronic apparatus, comprising an integrated circuit formed of the semiconductor device according to claim 1.

17. The electronic apparatus according to claim 16, wherein the electronic apparatus comprises a smart phone, a computer, a tablet, an artificial intelligence device, a wearable device, or a mobile power source.

18. A method of fabricating a semiconductor device, comprising:
forming a first source/drain layer on a substrate;
forming a channel layer on the first source/drain layer;
forming a second source/drain layer on the channel layer;
defining an active region of the semiconductor device in the first source/drain layer, the channel layer, and the second source/drain layer;
forming a gate stack around an outer circumference of the channel layer;
wherein in forming the first source/drain layer and forming the second source/drain layer, the method further comprises forming at least one interface structure in each of the first source/drain layer and the second source/drain layer, conduction band energy levels at both sides of the interface structure being different and/or valence band energy levels at both sides of the interface structure being different.

19. The method according to claim 18, wherein forming the first source/drain layer on the substrate comprises:
growing on the substrate and sequentially forming at least one of the first semiconductor layers and at least one of the second semiconductor layers alternately stacked;
wherein the interface structure is formed between the first semiconductor layer and the second semiconductor layer, a conduction band energy level or a valence band energy level of the first semiconductor layer being different from a conduction band energy level or a valence band energy level of the second semiconductor layer respectively, and the difference between the conduction band energy levels or the valence band energy levels being greater than or equal to a set threshold.

20. The method according to claim 18, wherein forming the second source/drain layer on the channel layer comprises:
growing on the channel layer and sequentially forming at least one of the fourth semiconductor layers and at least one of the third semiconductor layers alternately stacked;
wherein the interface structure is formed between the third semiconductor layer and the fourth semiconductor layer, a conduction band energy level or a valence band energy level of the third semiconductor layer being different from a conduction band energy level or a valence band energy level of the fourth semiconductor layer respectively, and the difference between the conduction band energy levels or the valence band energy levels being greater than or equal to a set threshold.

* * * * *